(12) United States Patent
Lasiter et al.

(10) Patent No.: US 11,223,116 B2
(45) Date of Patent: Jan. 11, 2022

(54) GLASS CERAMIC ANTENNA PACKAGE

(71) Applicant: QUALCOMM Incorporated, San Diego, CA (US)

(72) Inventors: Jon Lasiter, Stockton, CA (US); Seong Heon Jeong, San Diego, CA (US); Ravindra Vaman Shenoy, Dublin, CA (US); Jeremy Darren Dunworth, La Jolla, CA (US); Mohammad Ali Tassoudji, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 623 days.

(21) Appl. No.: 16/022,851

(22) Filed: Jun. 29, 2018

(65) Prior Publication Data

US 2020/0006846 A1 Jan. 2, 2020

(51) Int. Cl.
*H01Q 9/04* (2006.01)
*H01Q 1/38* (2006.01)
*H01Q 1/22* (2006.01)
*H05K 1/03* (2006.01)

(52) U.S. Cl.
CPC ............. *H01Q 1/38* (2013.01); *H01Q 1/2283* (2013.01); *H05K 1/0306* (2013.01)

(58) Field of Classification Search
CPC ........ H01Q 1/38; H01Q 1/2283; H01Q 9/285; H01Q 21/08; H05K 1/0306
See application file for complete search history.

(56) References Cited

U.S. PATENT DOCUMENTS

| | | | | |
|---|---|---|---|---|
| 4,187,529 | A * | 2/1980 | Bartley | H01L 21/4867 257/E23.068 |
| 2003/0151477 | A1* | 8/2003 | Hirabayashi | H01L 23/66 333/247 |
| 2007/0164420 | A1* | 7/2007 | Chen | H01L 25/16 257/691 |
| 2012/0092220 | A1* | 4/2012 | Tan | H01Q 7/00 343/702 |
| 2016/0056544 | A1* | 2/2016 | Garcia | H01Q 1/38 343/725 |
| 2017/0236785 | A1* | 8/2017 | Chen | H04B 15/00 257/659 |
| 2018/0323159 | A1* | 11/2018 | Kamgaing | H01L 25/18 |
| 2019/0189572 | A1* | 6/2019 | Chiang | H01L 23/5383 |
| 2019/0333881 | A1* | 10/2019 | Chen | H01L 23/3128 |
| 2020/0144723 | A1* | 5/2020 | Augustin | H01Q 21/065 |

* cited by examiner

*Primary Examiner* — David E Lotter
(74) *Attorney, Agent, or Firm* — Patterson & Sheridan, L.L.P.

(57) ABSTRACT

Certain aspects of the present disclosure provide a glass ceramic antenna package having a large bandwidth (e.g., 19 GHz) for millimeter wave (mmWave) applications, for example. The antenna package generally includes an antenna element comprising a first substrate layer and a second substrate layer, wherein the first substrate layer comprises an antenna, wherein the second substrate layer comprises shielding elements and feed lines, and wherein the feed lines are electrically coupled to the antenna. The antenna package also includes a lead frame adjacent to one or more lateral surfaces of the antenna element.

20 Claims, 7 Drawing Sheets

GLASS CERAMIC ANTENNA PACKAGE

BACKGROUND

Field of the Disclosure

Aspects of the present disclosure relate to wireless communications, and more particularly, to glass ceramic antenna packages having a large bandwidth for high frequency applications.

Description of Related Art

Fifth generation cellular networks, commonly referred to as 5G NR, are expected to include frequencies in the range of 24.25 to 86 GHz, with the lower 19.25 GHz (24.25 to 43.5 GHz) more likely to be used for mobile devices. For ease of reference, the waves in this range will be referred to as mmWaves. The 5G mmWave frequency range for mobile devices is expected to be divided into frequency segments depending on the geographic region for wireless communications. For instance, 5G NR capable mobile devices in Europe may be permitted to use a band of 24.25 GHz to 27.5 GHz, whereas 5G NR capable mobile devices in the United States may be permitted to use bands of 27.5 to 28.35 GHz and 37 to 40 GHz. Currently, each frequency segment is handled by a separate radio frequency integrated circuit (RFIC) and antenna package.

Current packaging strategies used for mmWave applications have several key issues. First, the size of the package is dictated by the antenna size, which is related to the frequency. The antenna size can be much larger than the RFIC. A low temperature co-fired ceramic (LTCC) package has good electrical performance, but is also more expensive relative to other packaging options. For an antenna-on-chip (AOC) package, the antenna is limited to the size of the chip, which can limit performance or increase cost if the chip size is increased to accommodate the antenna. For a fan-out wafer level package (FOWLP), the antenna package is aperture- or proximity-fed which can limit performance, e.g., relative to probe-fed packages. For a package-on-package (POP), the antenna and the chip packages are connected using solder balls. The solder balls used for connecting the packages are isotopic in dimension and thus limit the separation between packages. Additionally, the large solder balls also have large insertion losses (e.g., ~1 dB).

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved glass ceramic antenna packages for mmWave applications, for example.

Certain aspects provide an antenna package. The antenna package generally includes an antenna element comprising a first substrate layer and a second substrate layer, wherein the first substrate layer comprises an antenna, wherein the second substrate layer comprises shielding elements and feed lines, and wherein the feed lines are electrically coupled to the antenna. The antenna package also includes a lead frame adjacent to one or more lateral surfaces of the antenna element.

Certain aspects provide a device for wireless communication. The device generally includes an antenna package comprising an antenna element comprising a first substrate layer and a second substrate layer, wherein the first substrate layer comprises an antenna, wherein the second substrate layer comprises shielding elements and feed lines, and wherein the feed lines are electrically coupled to the antenna, and a lead frame adjacent to one or more lateral surfaces of the antenna element. The device also includes a radio frequency integrated circuit (RFIC) package electrically coupled to the shielding elements and the feed lines of the antenna package and comprising an RFIC.

Certain aspects provide a method of wireless communication. The method generally includes applying a first signal to an antenna package and receiving a second signal from the antenna package. The antenna package generally includes an antenna element and a lead frame adjacent to one or more lateral surfaces of the antenna element. The antenna element generally includes a first substrate layer and a second substrate layer, wherein the first substrate layer comprises an antenna, wherein the second substrate layer comprises shielding elements and feed lines, and wherein the feed lines are electrically coupled to the antenna.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Aspects of the present disclosure provide apparatuses and methods utilizing a glass ceramic antenna package having a large bandwidth (e.g., 15 GHz or greater) for mmWave applications, for example.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as LTE, CDMA, TDMA, FDMA, OFDMA, SC-FDMA, and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS).

New Radio (NR) is an emerging wireless communications technology under development in conjunction with the 5G Technology Forum (5GTF). 3GPP Long Term Evolution (LTE) and LTE-Advanced (LTE-A) are releases of UMTS that use E-UTRA. UTRA, E-UTRA, UMTS, LTE, LTE-A, and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above, as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

NR access (e.g., 5G technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications MTC (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

Example Wireless Communications System

Figure 1:
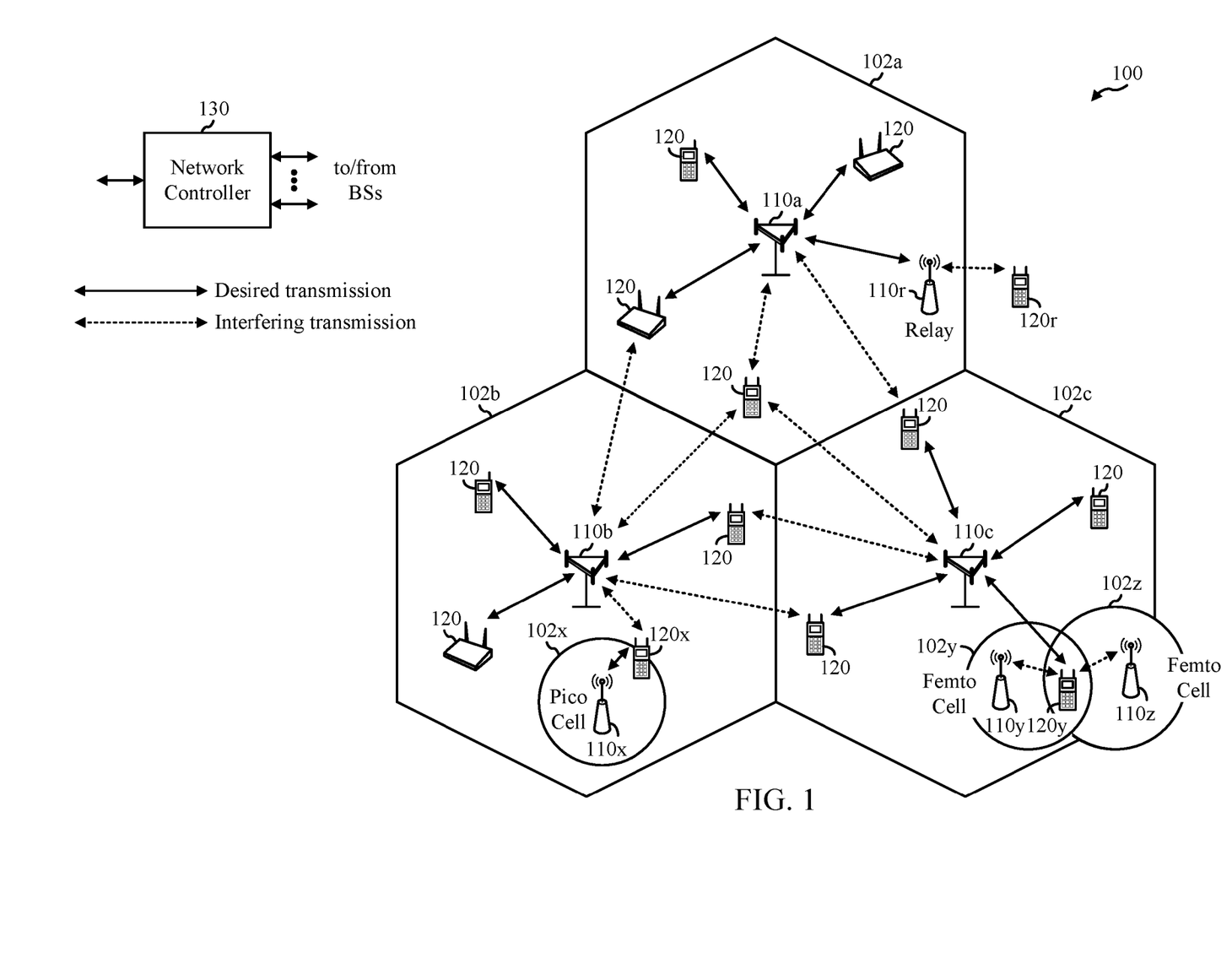
FIG. 1 is a block diagram conceptually illustrating an example telecommunications system, in accordance with certain aspects of the present disclosure.

FIG. 1 illustrates an example wireless communication network 100 in which aspects of the present disclosure may be performed. For example, the wireless communication network 100 may be a New Radio (NR) or 5G network employing the antenna package described herein for wireless communications.

As illustrated in FIG. 1, the wireless network 100 may include a number of base stations (BSs) 110 and other network entities. A BS may be a station that communicates with user equipments (UEs) 120. Each BS 110 may provide communication coverage for a particular geographic area. In 3GPP, the term "cell" can refer to a coverage area of a Node B (NB) and/or a Node B subsystem serving this coverage area, depending on the context in which the term is used. In NR systems, the term "cell" and next generation NodeB (gNB), new radio base station (NR BS), 5G NB, access point (AP), or transmission reception point (TRP) may be interchangeable. In some examples, a cell may not necessarily be stationary, and the geographic area of the cell may move according to the location of a mobile BS. In some examples, the base stations may be interconnected to one another and/or to one or more other base stations or network nodes (not shown) in wireless communication network 100 through various types of backhaul interfaces, such as a direct physical connection, a wireless connection, a virtual network, or the like, using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

A base station (BS) may provide communication coverage for a macro cell, a pico cell, a femto cell, and/or other types of cells. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b, and 110c may be macro BSs for the macro cells 102a, 102b, and 102c, respectively. The BS 110x may be a pico BS for a pico cell 102x. The BSs 110y and 110z may be femto BSs for the femto cells 102y and 102z, respectively. A BS may support one or multiple (e.g., three) cells.

Wireless communication network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

Wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, macro BS may have a high transmit power level (e.g., 20 watts (W)), whereas pico BS, femto BS, and relays may have a lower transmit power level (e.g., 1 W).

Wireless communication network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another (e.g., directly or indirectly) via wireless or wireline backhaul.

The UEs 120 (e.g., 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet (computer), a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system (GPS) device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a "resource block" (RB)) may be 12 subcarriers (or 180 kHz). Consequently, the nominal fast Fourier Transfer (FFT) size may be equal to 128, 256, 512, 1024, or 2048 for system bandwidth of 1.25, 2.5, 5, 10, or 20 megahertz (MHz), respectively. The system bandwidth may also be partitioned into subbands. For example, a subband may cover 1.08 MHz (e.g., 6 resource blocks), and there may be 1, 2, 4, 8, or 16 subbands for system bandwidth of 1.25, 2.5, 5, 10, or 20 MHz, respectively.

While aspects of the examples described herein may be associated with LTE technologies, aspects of the present disclosure may be applicable with other wireless communications systems, such as NR. NR may utilize OFDM with a cyclic prefix (CP) on the uplink and downlink and include support for half-duplex operation using time-division duplexing (TDD). Beamforming may be supported, and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells.

A scheduling entity (e.g., a base station) allocates resources for communication among some or all devices and equipment within its service area or cell. The scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. In some examples, a UE may function as a scheduling entity and may schedule resources for one or more subordinate entities (e.g., one or more other UEs), and the other UEs may utilize the resources scheduled by the UE for wireless communication. In some examples, a UE may function as a scheduling entity in a peer-to-peer (P2P) network, and/or in a mesh network. In a mesh network example, UEs may communicate directly with one another in addition to communicating with a scheduling entity.

In FIG. 1, a solid line with double arrows indicates desired transmissions between a UE and a serving BS, which is a BS designated to serve the UE on the downlink and/or uplink. A finely dashed line with double arrows indicates interfering transmissions between a UE and a BS.

Figure 2:
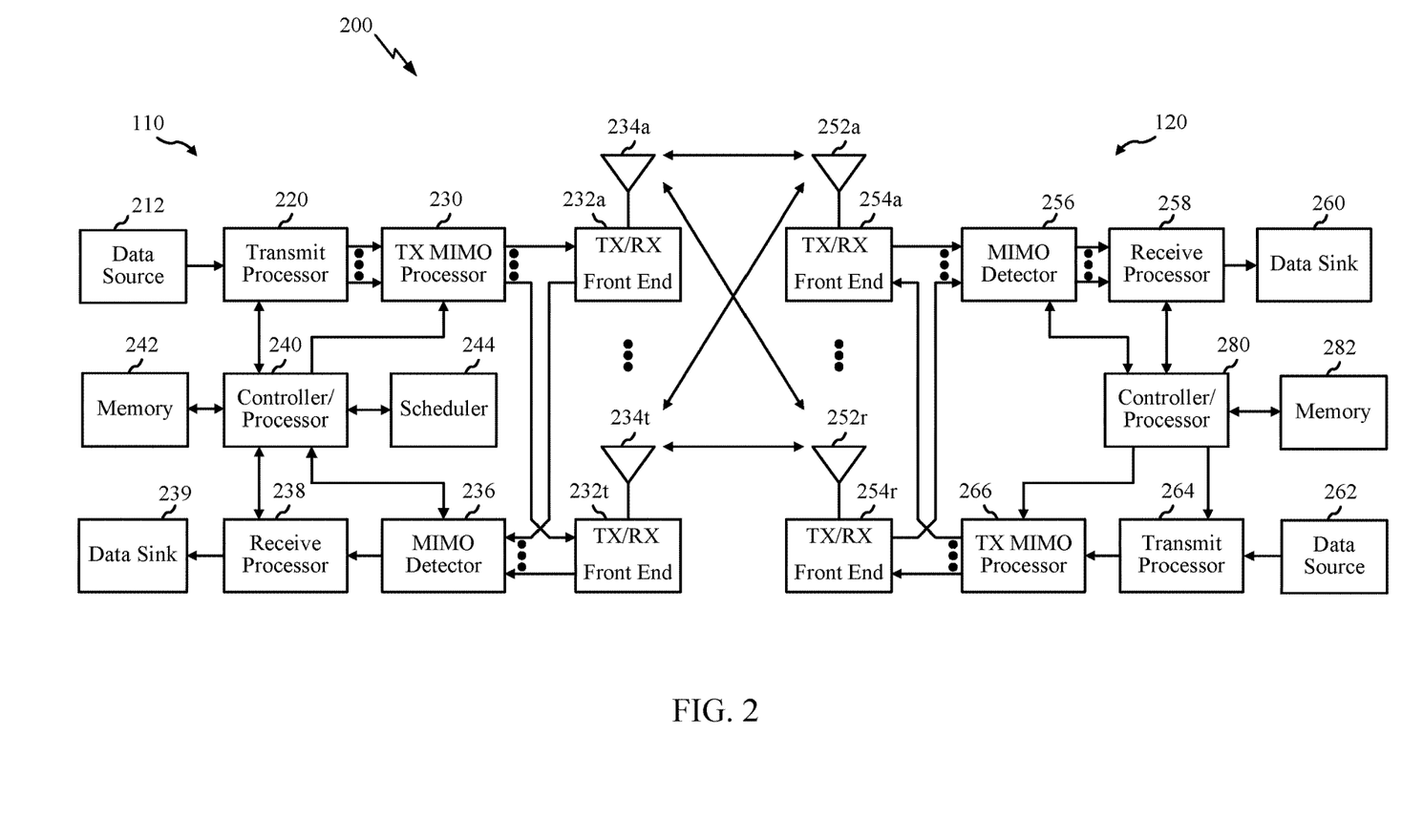
FIG. 2 is a block diagram conceptually illustrating a design of an example base station (BS) and user equipment (UE), in accordance with certain aspects of the present disclosure.
Figure 7:
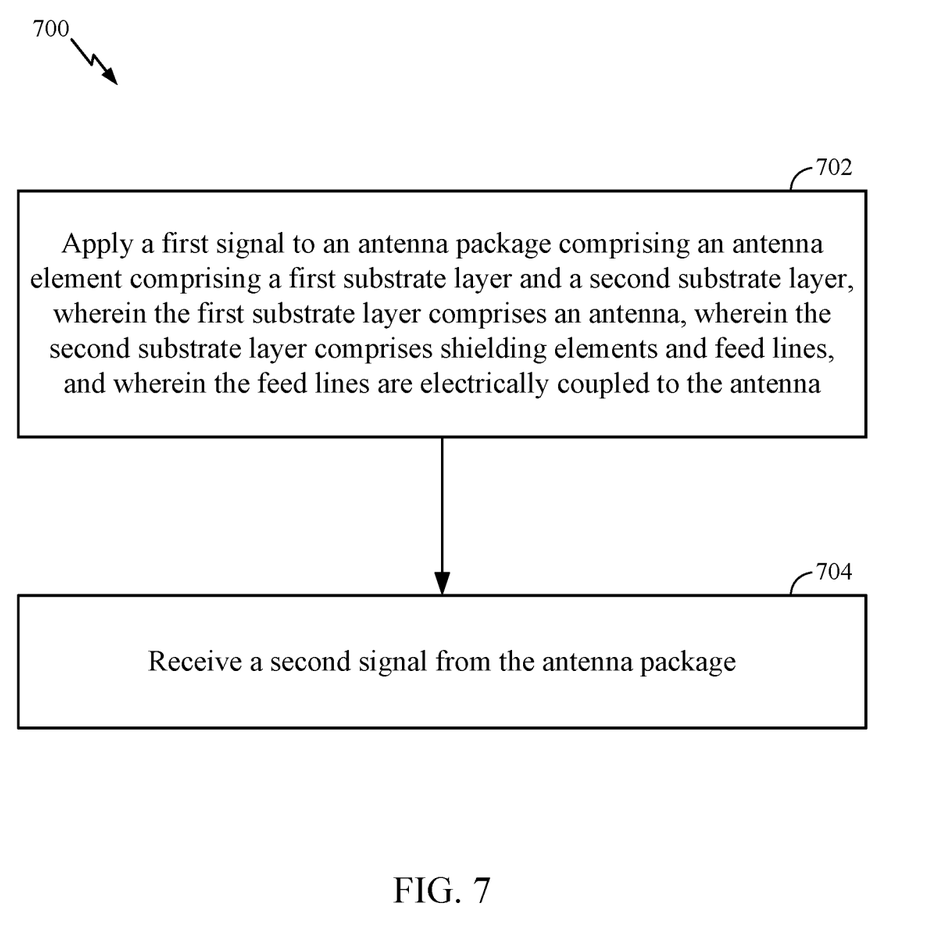
FIG. 7 is a flow diagram illustrating example operations that may be performed, for example, by a wireless device equipped with an antenna package described herein, in accordance with certain aspects of the present disclosure.

FIG. 2 illustrates example components of BS 110 and UE 120 (as depicted in FIG. 1), which may be used to implement aspects of the present disclosure. For example, antennas 252, processors 266, 258, 264, and/or controller/processor 280 of the UE 120 and/or antennas 234, processors 220, 240, 238, and/or controller/processor 240 of the BS 110 may be used to perform the various techniques and methods described herein, such as illustrated in FIG. 7.

At the BS 110, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), etc. The data may be for the physical downlink shared channel (PDSCH), etc. The processor 220 may process (e.g., encode and symbol map) the data and control information to obtain data symbols and control symbols, respectively. The processor 220 may also generate reference symbols, e.g., for the primary synchronization signal (PSS), secondary synchronization signal (SSS), and cell-specific reference signal (CRS). A transmit (TX) multiple-input multiple-output (MIMO) processor 230 may perform spatial processing (e.g., precoding) on the data symbols, the control symbols, and/or the reference symbols, if applicable, and may provide output symbol streams to the transmit (TX) front end circuits 232a through 232t. Each TX front end circuit 232 may process a respective output symbol stream (e.g., for OFDM, etc.) to obtain an output sample stream. Each TX front end circuit may further process (e.g., convert to analog, amplify, filter, and upconvert) the output sample stream to obtain a downlink signal. Downlink signals from TX front end circuits 232a through 232t may be transmitted via the antennas 234a through 234t, respectively.

At the UE 120, the antennas 252a through 252r may receive the downlink signals from the BS 110 and may provide received signals to the receive (RX) front end circuits 254a through 254r, respectively. Each RX front end circuit 254 may condition (e.g., filter, amplify, downconvert, and digitize) a respective received signal to obtain input samples. Each RX front end circuit may further process the input samples (e.g., for OFDM, etc.) to obtain received symbols. A MIMO detector 256 may obtain received symbols from all the RX front end circuits 254a through 254r, perform MIMO detection on the received symbols if applicable, and provide detected symbols. A receive processor 258 may process (e.g., demodulate, deinterleave, and decode) the detected symbols, provide decoded data for the UE 120 to a data sink 260, and provide decoded control information to a controller/processor 280.

On the uplink, at UE 120, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., for the sounding reference signal (SRS)). The symbols from the transmit processor 264 may be precoded by a TX MIMO processor 266 if applicable, further processed by the TX/RX front end circuits 254a through 254r (e.g., for SC-FDM, etc.), and transmitted to the BS 110. At the BS 110, the uplink signals from the UE 120 may be received by the antennas 234, processed by the TX/RX front end circuits 232, detected by a MIMO detector 236 if applicable, and further processed by a receive processor 238 to obtain decoded data and control information sent by the UE 120. The receive processor 238 may provide the decoded data to a data sink 239 and the decoded control information to the controller/processor 240.

The controllers/processors 240 and 280 may direct the operation at the BS 110 and the UE 120, respectively. The processor 240 and/or other processors and modules at the BS 110 may perform or direct the execution of processes for the techniques described herein. The memories 242 and 282 may store data and program codes for BS 110 and UE 120, respectively. A scheduler 244 may schedule UEs for data transmission on the downlink and/or uplink.

Figure 3:
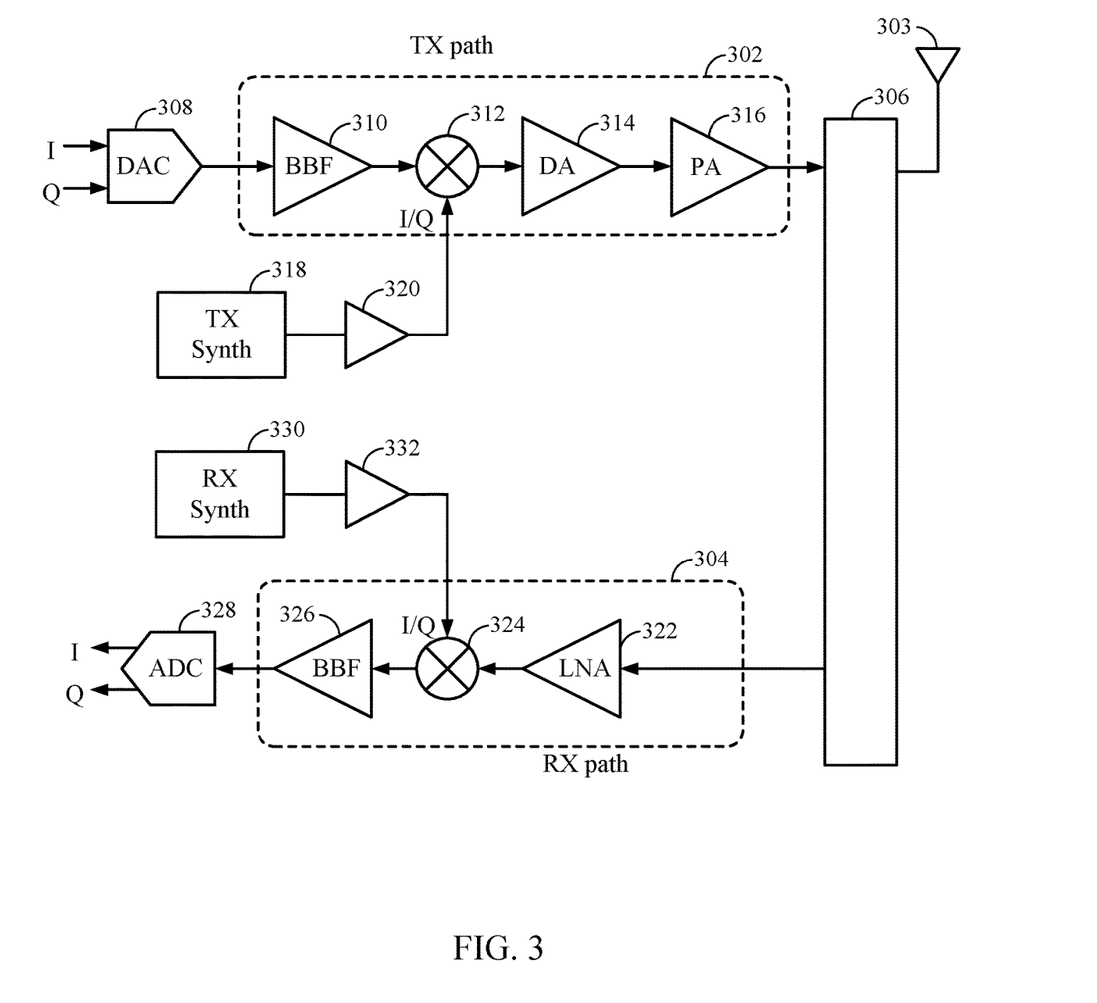
FIG. 3 is a block diagram showing an example transceiver front end, in accordance with certain aspects of the present disclosure.

FIG. 3 is a block diagram of an example transceiver front end 300, such as TX/RX front end circuits 232, 254 in FIG. 2, in which aspects of the present disclosure may be practiced. The transceiver front end 300 includes at least one transmit (TX) path 302 (also known as a transmit chain) for transmitting signals via one or more antennas and at least one receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be included in the RFIC or external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies between the LO frequency and the frequencies of the baseband signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 may include a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

Example Glass Ceramic Antenna Package

As indicated above, conventional packaging strategies for mmWave applications have several issues, such as the antenna packages only being operable over a portion of the mmWave band. Thus, multiple different antenna packages are typically included in wireless devices intended for such mmWave applications. The antenna package described herein provides several advantages over conventional mmWave packaging strategies. The antenna package described herein has a larger bandwidth than conventional antenna packages for mmWave applications. For instance, the antenna package described herein may have a bandwidth of 19.25 GHz covering frequencies ranging from 24.25 to 43.5 GHz. This enables the antenna package to be deployed in several geographic regions while adhering to the frequency band requirements of those regions. The antenna package described herein also utilizes a low cost, high yield packaging process. This enables the antenna packaging to be developed in scale to meet 5G NR demands across the globe.

Figure 4:
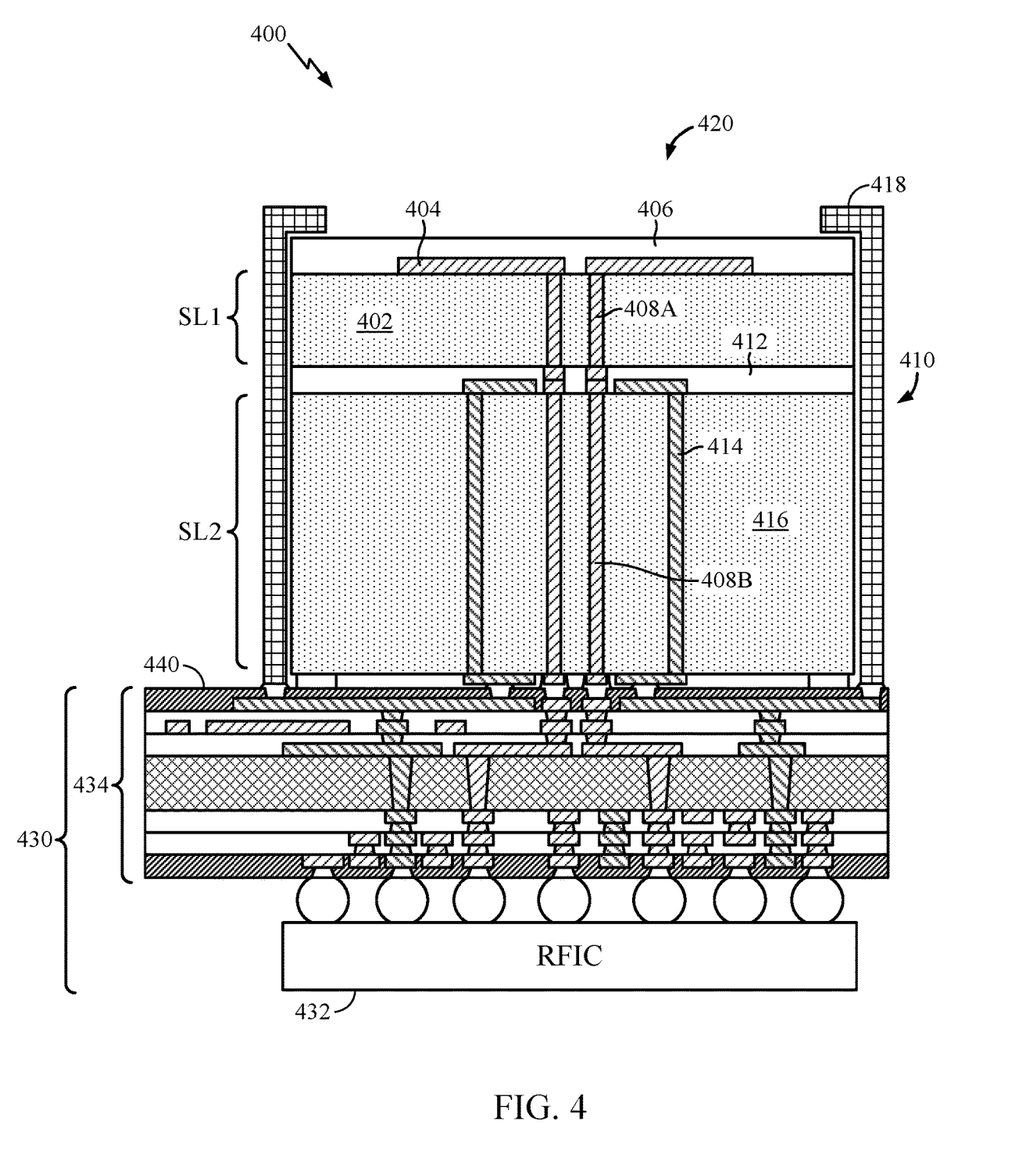
FIG. 4 illustrates a cross-sectional view of an example radio frequency (RF) front-end package, in accordance with certain aspects of the present disclosure.
Figure 6:
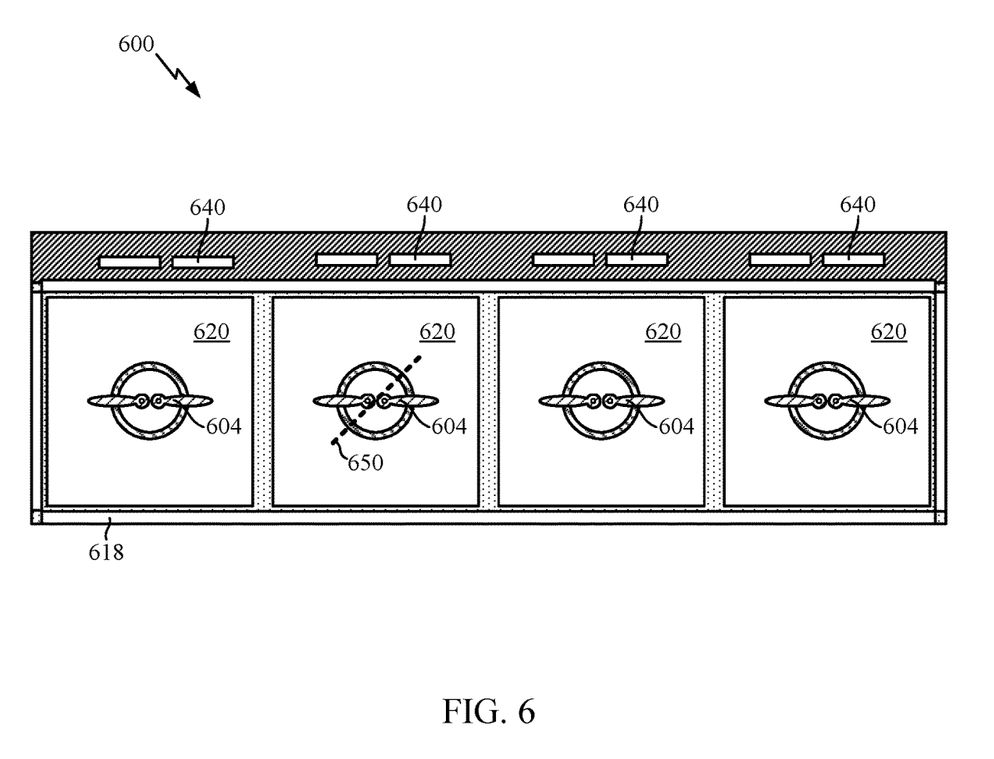
FIG. 6 illustrates a top view of an example multi-antenna package utilizing at least one of the antenna elements described herein, in accordance with certain aspects of the present disclosure.

FIG. 4 illustrates a cross-sectional view of an example radio frequency (RF) front-end package 400, in accordance with certain aspects of the present disclosure. The RF front-end package 400 includes an antenna package 410, an RFIC module 430, and an optional secondary antenna 440. The antenna package 410 may include one or more antennas, such as patch antennas and/or bow-tie antennas. For example, an antenna package having four bow-tie antennas is shown in FIG. 6 as further described below.

The antenna package 410 includes an antenna element 420 and a lead frame 418 adjacent to one or more lateral surfaces of the antenna element 420. The antenna element 420 may be implemented with a multi-layered substrate having a first substrate layer 402 and a second substrate layer 416. The first substrate layer 402 includes an antenna 404, such as a bow-tie antenna or a patch antenna. A portion of the antenna 404 may be arranged on top of the substrate layer 402 and covered with a protective layer of solder resist 406. Feed lines 408A may run through the first substrate layer 402 and electrically couple to the antenna 404. As an example, the first substrate layer 402 may have a thickness SL1 of 300 μm.

The lead frame 418 may include a stamped metal frame or a deposited electrically conductive layer. A stamped metal lead frame provides additional mechanical support to the antenna element 420. The lead frame 418 may be electrically coupled to a reference voltage, such as ground, and provide ground isolation between each antenna package 410 of a multi-antenna package. For instance, a conductive layer coupled to ground on the RFIC module 430 may be coupled to the stamped metal frame of the lead frame 418. That is, ground may be provided by depositing a conductive layer on the side walls of the antenna package 410 and connecting to ground from the RFIC module 430.

The second substrate layer 416 includes shielding elements 414 and feed lines 408B that are electrically coupled to the antenna 404. The shielding elements 414 may be electrically coupled to a reference voltage, such as ground, and configured to suppress electrical signals from interfering with the feed lines 408B (or from RF signals on the feed lines 408B radiating outward to interfere with other signals (e.g., in this or another device). In certain aspects, the shielding elements 414 may be electrically coupled to the lead frame 418. The feed lines 408B run through the second substrate layer 416 and are electrically coupled to the RFIC 432 via an interface 434 of the RFIC module 430. The feed lines 408A, 408B may include a conductive material (such as copper or a copper alloy) and conduct electrical signals to or from the RFIC module 430. The feed lines 408A, 408B may form conductive vias that have a high aspect ratio (e.g., 1:2 to 1:8). As an example, the second substrate layer 416 may have a thickness SL2 of 700 μm.

The first and second substrate layers 402, 416 may include a substrate material, such as a ceramic material and/or a glass material, having, for example, a dielectric constant of 6.0±1.5 and a loss tangent of 0.003 or less. For certain aspects, the first and second substrate layers 402, 416 may be coupled together via a bonding layer 412, which may comprise a photo-imageable wafer bonding material. For other aspects, the first and second substrate layers 402, 416 may be coupled together via a polymer bonding layer, glass frit, metal-to-metal bonding (e.g., bonding between feed lines 408A, 408B or other metal structures), laser bonding, or other suitable bonding techniques. The feed lines 408A of the first substrate layer 402 may be coupled to the feed lines 408B through the second substrate layer 416 via the bonding layer 412.

The RFIC module 430 includes an interface 434 and an RFIC 432. The RFIC module 430 may be arranged below the antenna package 410. The RFIC 432 may include various components of an RF front-end (e.g., any one or combination of LNA 322, mixers 324 and 312, BBFs 326 and 310, PA 316, or DA 314). The RFIC 432 may be configured to process RF signals received via the antenna package 410 and/or the secondary antenna 440. The RFIC 432 may also be configured to transmit RF signals via the antenna package 410 and/or the secondary antenna 440.

The RFIC 432 may be coupled to the interface 434, which may include one or more metal layers (e.g., six layers) for signal routing between the antenna package 410 and the RFIC 432. For example, the RFIC 432 may be a flip chip ball grid array (FCBGA) package coupled to the interface 434 via solder bumps on the ball grid array, and the interface 434 may have through-package vias to conduct electrical signals between the antenna package 410 and the RFIC 432. The interface 434 may be a package substrate, a laminate substrate, an interposer substrate, a printed circuit board (PCB) substrate, low temperature co-fired ceramic (LTCC) substrate, high temperature co-fired ceramic (HTCC) substrate, or other planar multilayer structure. The interface 434 may be organic or inorganic.

Figure 5A:
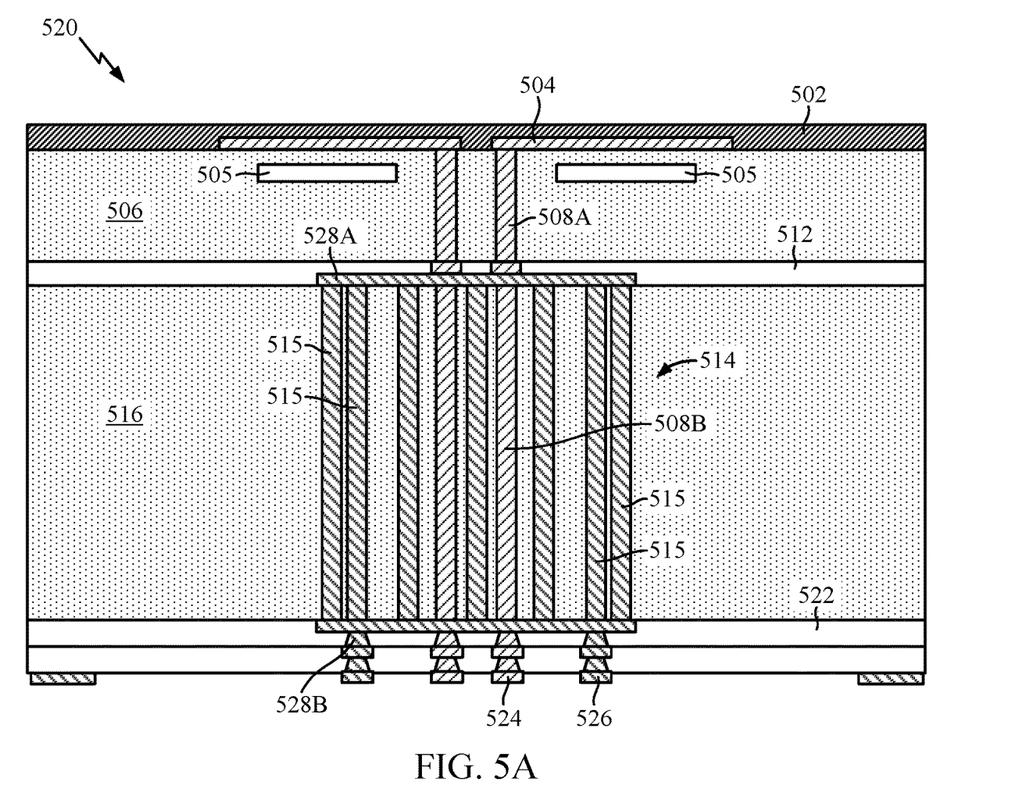
FIG. 5A illustrates a cross-sectional view of an example antenna element, in accordance with certain aspects of the present disclosure.

As another example of an antenna element, FIG. 5A illustrates a cross-sectional view of an antenna element 520, in accordance with certain aspects of the present disclosure. As shown, the shielding elements 514 of the antenna element 520 include conductive vias 515 coupled between a first conductive ring 528A arranged above an upper surface of the second substrate layer 516 and a second conductive ring 528B arranged below a lower surface of the second substrate layer 516. The first conductive ring 528A may also facilitate a metal-to-metal substrate connection between the first substrate layer 506 and the second substrate layer 516. For instance, the first substrate layer 506 may also include a conductive ring that bonds to the first conductive ring 528A. The shielding elements 514 are configured to suppress electrical signals from interfering with signals conducted through the feed lines 508B. In certain aspects, the shielding elements may include one or more ground planes arranged on the upper and/or lower surfaces of the second substrate layer 516 as substitute(s) for the conductive rings 528. For instance, the conductive rings may be replaced with ground planes that cover a greater surface area of the second substrate layer 516 than the conductive rings. Although the first and second conductive rings 528A, 528B are referred to as rings, the shape of the conductive rings 528A, 528B may not be round and may be any suitable shape for shielding the feed lines 508B.

In certain aspects, an additional antenna 505 may be suspended in the antenna element 520 on a different plane from the antenna 504 of the first substrate layer 506. For instance, the additional antenna 505 may be arranged below the antenna 504 inside the first substrate layer 502. This additional antenna may not be coupled to the feed lines. As such, the additional antenna may facilitate the reflection of signals radiating from the antenna 504.

The antenna element 520 also may include a redistribution layer 522 arranged below the second substrate layer 516 and comprising electrical interconnects 524, 526 for coupling the antenna to a front-end circuit (e.g., RFIC 432). The redistribution layer 522 may route interconnects 524, 526 to the feed lines 508B and conductive ring 528B, respectively. The redistribution layer 522 may have one or more layers in place one or more layers of the interface 434 when integrated with the RFIC module. In certain aspects, the antenna element 520 may be directly coupled to the RFIC 432 via the redistribution layer 522 without the interface 434. In certain aspects, the antenna element 520 is directly coupled to the RFIC 432 or interface 434 via the second substrate layer 516 without the redistribution layer.

Figure 5B:
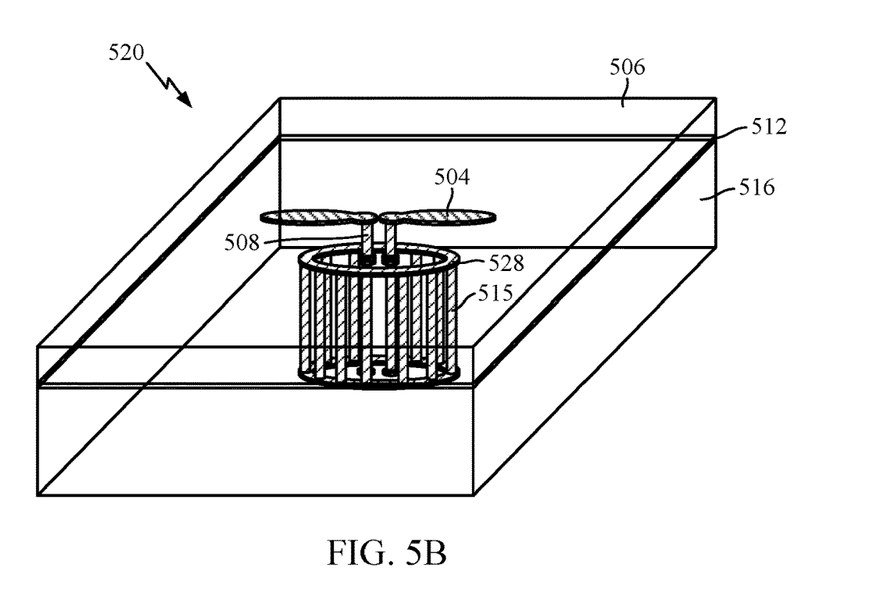
FIG. 5B illustrates an isometric view of the example antenna element of FIG. 5A, in accordance with certain aspects of the present disclosure.

FIG. 5B illustrates an isometric view of the example antenna element 520, in accordance with certain aspects of the present disclosure. As shown, the shielding elements 514 may be arranged in a bird-cage-like configuration, such that the vias 515 form conductive columns coupled between the conductive rings 528A, B. The shielding elements 514 surround the feed lines 508 within the second substrate layer 516.

In certain aspects, the RF front-end package may include a plurality of antenna elements to facilitate, for example, spatial diversity or beamforming. For example, FIG. 6 illustrates a top view of an example multi-antenna package 600 utilizing at least one of the antenna elements described herein (e.g., antenna package 420 or 520), in accordance with certain aspects of the present disclosure. As shown, the multi-antenna package 600 includes four antenna elements 620, each having an antenna 604, such as a bow-tie antenna. Although four antenna elements 620 are shown in the example of FIG. 6, the reader will understand that more or less than four antenna elements may be included in other aspects. The antennas 604 are arranged to be aligned with one another. That is, the antennas 604 are each tilted at the same angle. In certain aspects, at least one of the antennas 604 may be offset from another one of the antennas 604. That is, one of the antennas 604 may be angularly tilted relative to another one of the antennas 604. For instance, the second antenna 604 from the left may be aligned with line 650, such that the second antenna 604 is offset by 45° from the first antenna 604 from the left. For other aspects, a different angular offset may be used. The offset antennas may enable the antenna package to detect electrical signals having different polarities. The multi-antenna package 600 also includes multiple lead frames 618, which are adjacent to one or more lateral surfaces of the antenna elements 620, and secondary antennas 640, which may be dipole antennas.

FIG. 7 is a flow diagram illustrating example operations 700 that may be performed, for example, by a wireless device equipped with an antenna package (e.g., RF front-end package 400 or multi-antenna package 600), in accordance with certain aspects of the present disclosure.

Operations 700 may begin, at block 702, where the wireless device applies a first signal to an antenna package. The antenna package includes an antenna element comprising a first substrate layer and a second substrate layer, wherein the first substrate layer comprises an antenna, wherein the second substrate layer comprises shielding elements and feed lines, and wherein the feed lines are electrically coupled to the antenna. At block 704, the wireless device receives a second signal from the antenna package.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory) and the like. Also, "determining" may include resolving, selecting, choosing, establishing, and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware component(s) and/or module(s). Generally, where there are operations illustrated in figures, those operations may have corresponding counterpart means-plus-function components with similar numbering.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An antenna package comprising:
an antenna element comprising a first substrate layer and a second substrate layer, wherein the first substrate layer comprises an antenna, wherein the second substrate layer comprises shielding elements and feed lines, wherein the feed lines are electrically coupled to the antenna, wherein the shielding elements comprise conductive vias coupled between a conductive ring and a ground plane, and wherein the second substrate layer is arranged between the conductive ring and the ground plane; and
a lead frame adjacent to one or more lateral surfaces of the antenna element.

2. An antenna package comprising:
an antenna element comprising a first substrate layer and a second substrate layer, wherein the first substrate layer comprises an antenna, wherein the second substrate layer comprises shielding elements and feed lines, wherein the feed lines are electrically coupled to the antenna, and wherein the shielding elements comprise conductive vias coupled between a first conductive ring arranged above an upper surface of the second substrate layer and a second conductive ring arranged below a lower surface of the second substrate layer; and
a lead frame adjacent to one or more lateral surfaces of the antenna element.

3. The antenna package of claim 1, wherein the shielding elements surround the feed lines within the second substrate layer.

4. An antenna package comprising:
an antenna element comprising a first substrate layer and a second substrate layer, wherein the first substrate layer comprises an antenna, wherein the second substrate layer comprises shielding elements and feed lines, wherein the feed lines are electrically coupled to the antenna, wherein the shielding elements comprise conductive vias coupled between a first ground plane and a second ground plane and wherein the second substrate layer is disposed between the first ground plane and the second ground plane; and
a lead frame adjacent to one or more lateral surfaces of the antenna element.

5. The antenna package of claim 1, wherein at least one of the first substrate layer or the second substrate layer comprises a ceramic material or a glass material.

6. The antenna package of claim 1, further comprising a bonding layer configured to couple the first substrate layer to the second substrate layer, wherein the bonding layer comprises a photo-imageable wafer bonding material.

7. The antenna package of claim 1, further comprising a redistribution layer arranged below the second substrate layer and comprising electrical interconnects for coupling the antenna to a front-end circuit.

8. The antenna package of claim 1, further comprising a protective solder resist layer arranged above the first substrate layer.

9. The antenna package of claim 1, wherein the lead frame comprises a stamped metal frame or a deposited conductive layer.

10. The antenna package of claim 1, wherein the antenna comprises a bowtie antenna.

11. The antenna package of claim 1, wherein the antenna element comprises an additional antenna on a different plane from the antenna of the first substrate layer.

12. The antenna package of claim 1, wherein the shielding elements and the feed lines of the antenna package are configured to electrically couple to a radio frequency integrated circuit (RFIC).

13. The antenna package of claim 1, further comprising one or more additional antenna elements having other lead frames.

14. The antenna package of claim 13, wherein one or more antennas of the one or more additional antenna elements are aligned with the antenna of the antenna element.

15. The antenna package of claim 13, wherein at least one antenna of the one or more additional antenna elements is offset from the antenna of the antenna element.

16. The antenna package of claim 1, wherein the lead frame is electrically coupled to the shielding elements.

17. A device for wireless communication, comprising the antenna package of claim 1, the device further comprising a radio frequency integrated circuit (RFIC) electrically coupled to the shielding elements and the feed lines of the antenna package.

18. The device of claim 17, further comprising one or more dipole antennas electrically coupled to the RFIC.

19. The antenna package of claim 2, wherein at least one of the first substrate layer or the second substrate layer comprises a ceramic material or a glass material.

20. The antenna package of claim 4, wherein at least one of the first substrate layer or the second substrate layer comprises a ceramic material or a glass material.

* * * * *